United States Patent [19]

Hirukawa

[11] Patent Number: 5,493,402
[45] Date of Patent: Feb. 20, 1996

[54] EGA ALIGNMENT METHOD USING A PLURALITY OF WEIGHTING COEFFICIENTS

[75] Inventor: Shigeru Hirukawa, Kashiwa, Japan

[73] Assignee: Nikon Corporation, Tokyo, Japan

[21] Appl. No.: 425,244

[22] Filed: Apr. 17, 1995

Related U.S. Application Data

[63] Continuation of Ser. No. 226,327, Apr. 12, 1994, abandoned.

[30] Foreign Application Priority Data

Apr. 13, 1993 [JP] Japan ................... 5-086067

[51] Int. Cl.$^6$ ................... G01B 11/00
[52] U.S. Cl. ................... 356/400; 356/401; 355/53; 250/548
[58] Field of Search ................... 356/400, 401; 250/548; 355/53

[56] References Cited

U.S. PATENT DOCUMENTS

| | | | |
|---|---|---|---|
| 4,362,385 | 12/1982 | Lobach | 250/548 |
| 4,780,615 | 10/1988 | Suzuki | 356/401 |
| 4,780,617 | 10/1988 | Umatate et al. | 356/401 |
| 4,811,059 | 3/1989 | Hamasaki et al. | 355/53 |
| 4,861,162 | 8/1989 | Ina | 355/53 |
| 5,124,927 | 6/1992 | Hopewell et al. | 356/401 |
| 5,151,750 | 9/1992 | Magome et al. | 356/401 |
| 5,153,678 | 10/1992 | Ota | 356/401 |
| 5,272,501 | 12/1993 | Nishi et al. | 356/401 |

*Primary Examiner*—F. L. Evans
*Attorney, Agent, or Firm*—Shapiro and Shapiro

[57] ABSTRACT

An alignment method for aligning each of plural process areas arranged on a substrate to a specified point in a fixed coordinate system defining a position of movement of the substrate, comprises measuring the positions of a number of specified areas, selected in advance from the plural process areas on the substrate; determining plural amounts of deformation between the specified areas and one of the process areas; determining plural weighting coefficients corresponding to the plural amounts of distortion, for each of the specified areas; and calculating the coordinate position of the one of the process areas on the fixed coordinate system, by statistical processing of the measured coordinate positions of the specified areas, utilizing the plural weighting coefficients.

18 Claims, 8 Drawing Sheets

EGA ALIGNMENT METHOD USING A PLURALITY OF WEIGHTING COEFFICIENTS

This is a continuation of application Ser. No. 08/226,327, filed Apr. 12, 1994, now abandoned.

BACKGROUND OF THE INVENTION

1. Field of the Invention

The present invention relates to a method of alignment adapted for use, in an exposure apparatus for exposing in succession shot areas of a wafer to a reticle pattern based on the coordinates of arrangement calculated for example by statistical processing, for aligning the shot areas of the wafer in succession.

2. Related Background Art

In the manufacture of semiconductor devices, liquid crystal display devices, thin film magnetic heads and the like with a photolithographic process, there is generally employed a projection exposure apparatus for projecting the image of a pattern of a photomask or a reticle (hereinafter collectively called reticle), through a projection optical system, onto each of shot areas of a wafer coated with a photosensitive material. Among such projection exposure apparatus, there are widely employed, in recent years, exposure apparatus of so-called step-and-repeat type, in which the wafer is placed on a two-dimensionally movable stage and is stepwise moved by said stage, whereby the shot areas of the wafer are exposed in succession to the image of the reticle pattern, particularly the exposure apparatus of reduction projection type, generally called stepper.

As an example, the semiconductor device is prepared by superposing circuit patterns of plural layers on the wafer. Therefore, in the projection exposures of the circuit patterns of the second and subsequent layers, there is required precise alignment between each shot area of the wafer, bearing already formed circuit patterns, and the image of the reticle pattern, or between the wafer and the reticle. The conventional steppers or the like have generally adopted the following enhanced global alignment method (hereinafter represented as EGA method), as described, for example, in the U.S. Pat. No. 4,780,617 issued Oct. 25, 1988.

In this EGA method, the wafer bears plural shot areas (chip pattern), each containing an alignment mark, called wafer mark, and these shot areas are arranged in a regular pattern, based on the coordinates of arrangement predetermined on the wafer. However, the wafer stepping operation based on the designed coordinates of arrangement (shot arrangement) of the plural shot areas on the wafer cannot necessarily achieve desired precise alignment of the wafer, because of the following factors:

(1) remnant rotational error θ of the wafer;

(2) error w in orthogonality in the stage coordinate system (or in the shot arrangement);

(3) linear elongation/contraction Rx, Ry of the wafer; and (4) offset (parallel displacement) Ox, Oy of the center position of the wafer.

Transformation of the wafer coordinates, corresponding to these four errors (or six parameters) can be defined by first-order equations. Consequently there can be defined the following first-order transformation model with six transformation parameters a–f, in order to transform the coordinate values of a sample coordinate system (x, y) on the wafer into those of a fixed coordinate system (X, Y) on the stage, with respect to the wafer bearing a regular arrangement of plural shot areas with wafer marks:

$$\begin{bmatrix} X \\ Y \end{bmatrix} = \begin{bmatrix} a & b \\ c & d \end{bmatrix} \begin{bmatrix} x \\ y \end{bmatrix} + \begin{bmatrix} e \\ f \end{bmatrix} \quad (1)$$

The six parameters a–f in this transforming equation can be determined for example by minimum square approximation. In this case, a certain number of shot areas (hereinafter called sample shots) are selected from the plural shot areas (chip pattern) on the wafer, then the alignment to a reference position is conducted on each of the wafer marks, respectively associated with thus selected sample shot areas and having design coordinates (x1, y1), (x2, y2), ..., (xn, yn) on the coordinate system (x, y), and there are measured the coordinate values (xM1, yM1), (xM2, yM2), ..., (xMn, yMn) on the stage coordinate system (X, Y).

The difference (Δx, Δy) between the calculated arrangement coordinate (Xi, Yi) obtained by substituting the design arrangement coordinate (xi, yi) (i=1, 2, ..., n) of thus selected wafer marks in the above-mentioned first-order transformation model, and the measured coordinate (xMi, yMi) at the alignment is considered as the alignment error. The alignment error Δx can be represented by a summation of $(Xi-xMi)^2$ for different values of i, while the alignment error Δy can be represented by a summation of $(Yi-yMi)^2$ for different values of i.

The six transformation parameters a–f can be determined by partially differentiating these alignment errors Δx and Δy in succession with the parameters a–f and solving six simultaneous equations obtained by assuming the results of these differentiations as equal to zero. Thus the alignment of each shot area on the wafer can be achieved with the arrangement coordinates, calculated with the first-order transformation equations employing thus determined transformation parameters a–f. If the accuracy of approximation is not sufficient with such first-order transformation equations, the wafer alignment may be conducted with second- or higher-order equations.

However, the above-explained conventional technology has been associated with a drawback that, if the wafer to be exposed contains non-linear distortion, the remnant error corresponding to such non-linear distortion generates an alignment error. For this reason, the present applicant has proposed, for use in the presence of such distortion, a weighted EGA method based on a principle that the influence of non-linear error resulting from distortion becomes smaller as the distance of the shot area to be exposed (hereinafter called "exposed shot") from a predetermined reference point in the wafer to be exposed is smaller (The 40th Applied Physics Related United Symposium, Spring 1993, 31a-L-8).

In this weighted EGA method, the weighting method is linearly approximated by giving a larger weighting to a sample shot closer to the exposed shot or to the reference point (for example center of distortion) within the exposed wafer. Then the components of the correction for the offset, rotation scaling and orthogonality of wafer are determined for each exposed shot, and the exposure is conducted by setting each exposed shot at a position corrected by the above-mentioned correcting components. However, though this weighted EGA method assumes simply that the influence of distortion is smaller for the sample shot closer to the exposed shot or to the predetermined reference point, the amount of distortion may in practice be independent from the distance between the shots or to the reference point. For example, if the wafer involves a local distortion, the amount of the distortion may become large independently from the distance between the shots or the distance to the reference point. For this reason, there are encountered cases in which the alignment error resulting from the non-linear distortion cannot be reduced even with the above-explained weighted EGA method.

SUMMARY OF THE INVENTION

In consideration of the foregoing, an object of the present invention is, in the alignment method of actually measuring the positions of sample shots on the wafer to be processed, determining transformation parameters by statistical processing of the results of such position measurements and aligning each shot on the wafer based on the arrangement coordinates calculated with said transformation parameters, to enable highly precise alignment even when the wafer to be exposed contains a local non-linear distortion.

The alignment method of the present invention comprises measuring the positions of specified areas among plural areas to be processed on the substrate, determining the amount of distortion between thus measured positions of specified areas and an area to be processed, then determining the weighting coefficient corresponding to the amount of distortion on each of the specified areas, and statistically processing the coordinate positions of the measured specified areas with thus determined weighting coefficients, thereby calculating the coordinate position of the area to be processed on the fixed coordinate system.

The above-mentioned step of calculating the coordinate position of the area to be processed on the fixed coordinate system may be so conducted as to calculate the coordinate positions of plural areas to be processed.

Also the step of determining the amount of distortion comprises determining a separate weighting coefficient according to the distance between the center of deformation of the substrate (for example the actual center of the substrate) and the area to be processed and also according to the distances between the center of deformation of the substrate and specified areas, thereby effecting another weighting to the measured values of specified areas, then calculating the coordinate positions of the above-mentioned plural areas to be processed, according to the measured values of the specified areas subjected to another weighting, and processing the coordinate positions of the area to be processed and the adjacent areas to be processed, thereby determining the internal distortion of the area to be processed. The internal distortion is determined on plural areas to be processed on the substrate, and the amount of distortion between the specified areas and the area to be processed can be determined from the integrated value of the internal distortions between the specified areas and an area to be processed.

According to the present invention, as the weighting coefficients assigned to the sample areas are varied according to the integrated value of the amounts of distortion between the area to be processed and the sample areas, there can be achieved highly precise alignment even in case the substrate contains a local distortion.

BRIEF DESCRIPTION OF THE DRAWINGS

in FIG. 1;

DETAILED DESCRIPTION OF THE PREFERRED EMBODIMENTS

Now the present invention will be clarified in detail by an embodiment thereof, with reference to the attached drawings.

Figure 1:
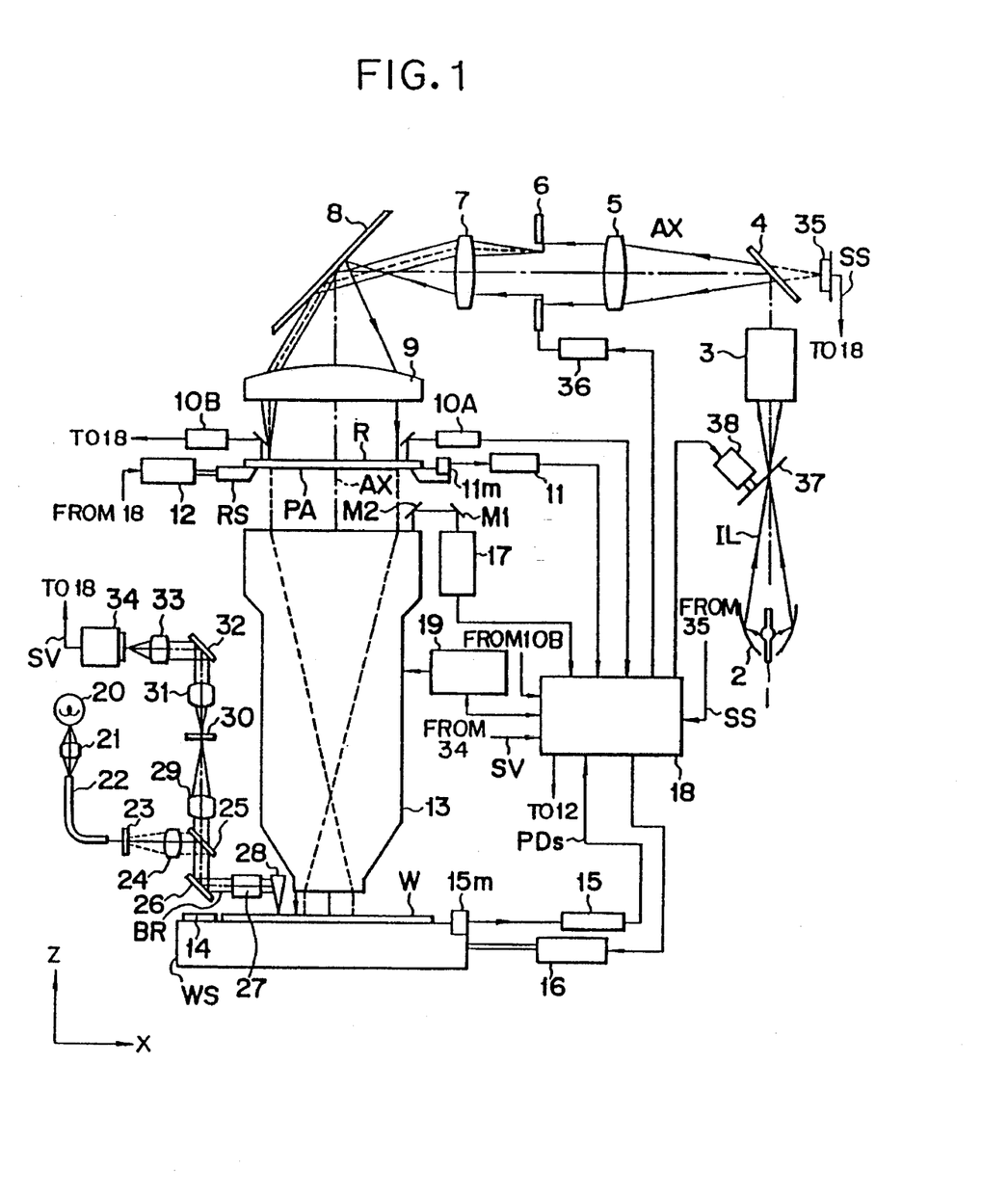
FIG. 1 is a schematic view of a projection exposure apparatus embodying the alignment method of the present invention.

FIG. 1 schematically illustrates a projection exposure apparatus in which the alignment method of the present invention is applicable. The illuminating light IL emitted from an ultra high pressure mercury lamp 1 is condensed by reflection by an elliptical mirror 2 onto the second focal point thereof, and enters an illuminating optical system 3 containing a collimating lens, an interference filter, an optical integrator (fly's eye lens), a diaphragm (σ diaphragm) etc. Though not illustrated, the fly's eye lens is positioned in a plane perpendicular to the optical axis AX, in such a manner that the focal plane thereof at the reticle side substantially coincides with the Fourier converted plane of the reticle pattern (plane conjugate with the pupil).

In the vicinity of the 2nd focal point of the elliptical mirror 2, there is provided a shutter (for example a rotary shutter with four blades) 37 for opening and intercepting the optical path of the illuminating light IL, by means of a motor 38. The exposing illuminating light may be obtained not only by an emission spectrum of the ultra high pressure mercury lamp 1 but also by laser light from an excimer laser (for example KrF or ArF excimer laser) or by a hypertonic wave of a metal vapor laser or a YAG laser.

The illuminating light IL of a wavelength region actinic to the photoresist layer (for example i-line), emerging from the illuminating optical system 3, is mostly reflected by a beam splitter 4, then guided through a 1st relay lens 5, a variable field diaphragm (reticle blind) 6 and a 2nd relay lens 7, and reaches a mirror 8. The illuminating light IL reflected substantially downward by the mirror 8 illuminates a pattern area PA of a reticle R with a substantially uniform intensity, through a main condenser lens 9. The plane of the reticle blind 6 is conjugate (in imaging relationship) with the pattern bearing face of the reticle R, and the illumination field thereon can be arbitrarily selected by varying the size and shape of the aperture of the reticle blind 6 through the movement of plural movable blades defining said aperture, by means of a driving system 36.

In the reticle R of the present embodiment, a reticle mark, serving as an alignment mark, is provided at the approximate center of each of the four sides of the pattern area PA, surrounding by an opaque area, and the images of these reticle marks are projected onto a photoresist layer on the wafer W whereby latent images of said reticle marks are formed therein. In the present embodiment, these reticle marks are used also as alignment marks for aligning the reticle with each of the shot areas of the wafer W. These four reticle marks have a same configuration (though different in direction). For example, a wafer mark for the X-axis is composed of multiple marks, consisting of 5 lines, arranged with a specified interval in the X-direction, of diffraction grating patterns, each containing 7 dots arranged in the Y-direction. These wafer marks are formed with opaque parts composed for example of chromium, formed in transparent windows provided in the opaque area of the reticle R. The reticle R is further provided, in the vicinity of the external periphery thereof, with two cross-shaped opaque alignment marks, in mutually opposed positions. These two alignment marks are used for the alignment of the reticle R, namely the alignment of the projection optical system 13 with respect to the optical axis AX.

The reticle R is placed on a reticle stage RS, which is rendered finely movable by a motor 12 in the direction of the optical axis AX of the projection optical system 13 and is capable of two-dimensional displacement and fine rotation within a horizontal plane perpendicular to the optical axis AX. At an end of the reticle stage RS there is fixed a movable mirror 11m for reflecting the laser beam from a laser interferometer 11, which constantly detects the two-dimensional position of the reticle stage RS with a resolution for example of about 0.01 µm. Above the reticle R there are provided reticle alignment systems (RA systems) 10A, 10B, for detecting the two cross-shaped alignment marks formed in the vicinity of the external periphery of the reticle R. The reticle stage RS is finely moved according to the measurement signals from the RA systems 10A, 10B in such a manner that the center of the pattern area PA of the reticle R coincides with the optical axis AX of the projection optical system 13.

The illuminating light IL, transmitted by the pattern area PA of the reticle R, enters the projection optical system 13 which is telecentric on both sides, and a projected image of the circuit pattern of the reticle R, reduced to ⅕ in size by the projection optical system 13, is focused in a shot area on the wafer W, bearing a photoresist layer thereon and supported in such a manner that the surface thereof substantially coincides with the best focal plane of the projection optical system 13.

The wafer W is fixed by suction to a wafer holder (not shown) capable of fine rotation, and is supported on a wafer stage WS. The wafer stage WS is rendered capable of two-dimensional displacement in step-and-repeat manner by a motor 16, and, upon completion of exposure, to the image of the reticle R, of a shot area on the wafer W, is stepped to a next shot position. At an end of the wafer stage WS there is fixed a movable mirror 15m for reflecting the laser beam from a laser interferometer 15, which constantly detects the two-dimensional position of the wafer stage WS with a resolution for example of about 0.01 µm. The laser interferometer 15 measures the coordinates of the wafer stage WS in a direction (X-direction) perpendicular to the optical axis AX of the projection optical system 13 and in a Y-direction perpendicular thereto, and the stage coordinate system (fixed coordinate system) (X, Y) is defined by these coordinates in the X- and Y-directions. Stated differently, the coordinate values of the wafer stage WS measured by the laser interferometer 15 are those on the stage coordinate system (X, Y).

On the wafer stage WS, there is provided a reference member (glass plate) 14, having a reference mark to be used for example in the measurement of the baseline amount (to be explained later), at a substantially same height as the exposed face of the wafer W. The reference member 14 is provided, as the reference mark, with a slit pattern consisting of five translucent L-shaped patterns and two sets of reference patterns (duty ratio 1:1) formed with reflective chromium. One of the sets is composed of three diffraction grating marks, arranged in the X-direction and each consisting of seven dots arranged in the Y-direction, a diffraction grating mark consisting of three straight patterns arranged in the X-direction, and twelve bar marks extending in the Y-direction, positioned along the X-direction. The other set is the same as above but rotated by 90°.

The slit patterns formed on the reference member 14 are illuminated from below (from the interior of the wafer stage WS), by the illuminating (exposing) light transmitted to below the reference member 14 for example with optical fibers (not shown). The illuminating light transmitted by the slit patterns of the reference member 14 forms, through the projection optical system 13, a projection image of the slit patterns on the rear face (pattern bearing face) of the reticle R. Also the illuminating light, transmitted by any of four reticle marks on the reticle R, reaches the beam splitter 4 through the main condenser lens 9, relay lenses 7, 5 etc. and the light transmitted by the beam splitter 4 is received by a photodetector 35 positioned in the vicinity of a plane conjugate with the pupil of the projection optical system 13 and sends a photoelectric signal SS corresponding to the intensity of the illuminating light to a main control system 18. In the following description, the optical fibers (not shown), the reference member 14 and the photodetector 35 will be collectively called an ISS (imaging slit sensor) system.

In FIG. 1 there is also provided an imaging characteristics correcting portion 19 for regulating the imaging characteristics of the projection optical system 13. In this embodiment, the correcting portion 19 independently drives (movement in the direction of the optical axis AX) a part of the lens elements constituting the projection optical system 13, particularly plural lens elements close to the reticle R, for example with piezoelectric elements, thereby correcting the imaging characteristics such as the magnification of projection or distortion of the projection optical system 13.

At a side of the projection optical system 13, there is provided an off-axis alignment sensor (hereinafter called field image alignment (FIA) system). In this FIA system, the light emitted by a halogen lamp 20 is transmitted through a condenser lens 21 and optical fibers 22 to an interference filter 23 for eliminating the light of a wavelength region actinic to the photoresist layer and the light of the infrared region. The light transmitted by the interference filter 23 is guided by a lens system 24, a beam splitter 25, a mirror 26 and a field diaphragm BR and enters a telecentric objective lens 27, and the light emerging therefrom is reflected by a prism (or a mirror) 28 positioned below and outside the projection optical system 13, so as not to interfere with the illuminating field thereof, thereby substantially perpendicularly illuminating the wafer W.

The light from the objective lens 27 illuminates a partial area including a wafer mark on the wafer W, and the light reflected from that area is guided through the prism 28, objective lens 27, field diaphragm BR, mirror 26, beam splitter 25 and lens system 29 to an index plate 30, which is positioned on a plane conjugate with the wafer W with respect to the objective lens 27 and the lens system 29, whereby an image of the wafer mark on the wafer W is focused on a transparent window of the index plate 30. The index plate 30 is further provided, in the transparent window, with an index mark consisting of two linear marks extending in the Y-direction and separated by a predetermined distance in the X-direction. The light transmitted by the index plate 30 is guided by a 1st relay lens system 31, a mirror 32 and a 2nd relay lens system 33 to an image pickup device (CCD camera or the like) 34, whereby images of the wafer mark and the index mark are formed on the light-receiving face thereof. An image signal SV from the image pickup device 34 is supplied to the main control system 18 for calculating the position (coordinate value) of the wafer mark in the X-direction. In addition to the above-explained FIA system for the X-axis, there is provided, though not illustrated, another FIA system for detecting the mark position in the Y-direction.

Laterally to the upper part of the projection optical system 13, there is provided an alignment sensor 17 of TTL (through-the-lens) system, from which position detecting light is guided by way of mirrors M1, M2 to the projection optical system 13. The position detecting light irradiates the wafer mark on the wafer W through the projection optical system 13, and the light reflected from the wafer mark returns through the projection optical system 13, and the mirrors M1, M2 to the alignment sensor 17, which determines the position of the wafer mark on the wafer W from a signal obtained by photoelectric conversion of the returning light.

Figure 2:
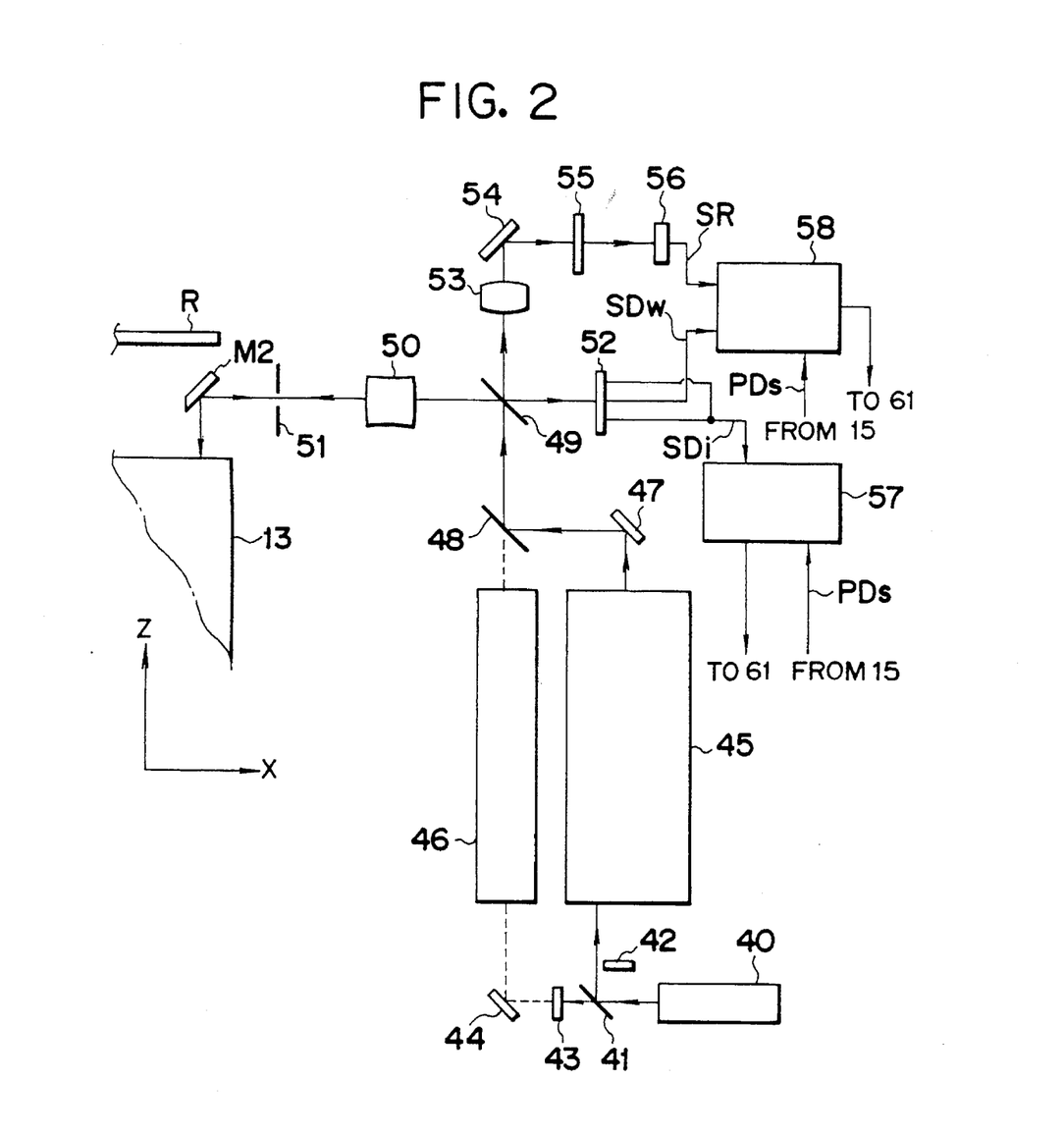
FIG. 2 is a block diagram showing the details of a TTL alignment sensor 17 shown in FIG. 1.

FIG. 2 shows the detailed structure of the TTL alignment sensor 17 shown in FIG. 1. The alignment sensor 17 of the present embodiment is composed of a two-beam interference alignment system (hereinafter called LIA system) and a laser step alignment system (hereinafter called LSA system), so combined as to utilize the optical elements in common as far as possible. In the following there will be given a brief description on these systems, but more detailed description is given in the U.S. Pat. No. 5,151,750 issued Sep. 29, 1992.

Referring to FIG. 2, a laser beam emitted from a light source (such as a He-Ne laser) 40 is split by a beam splitter 41, and the laser beam reflected therein enters a 1st beam forming optical system (LIA optical system) 45 through a shutter 42. On the other hand, the laser beam transmitted by the beam splitter 41 enters a 2nd beam forming optical system (LSA optical system) 46 through a shutter 43 and a mirror 44. Consequently the LIA system and the LSA system can be switched by suitably driving the shutters 42, 43.

The LIA optical system 45 is provided with two sets of acoustooptical modulators, and emits two laser beams with a predetermined frequency difference $\Delta f$ in substantially symmetrical manner across the optical axis. The two laser beams emitted from the LIA optical system 45 reach a beam splitter 49 by way of a mirror 47 and a beam splitter 48, and the two laser beams transmitted by the beam splitter 49 are guided through a lens system (inverse Fourier conversion lens) 53 and a mirror 54, and enter a reference diffraction grating 55, fixed on the apparatus, from mutually different directions with a predetermined crossing angle. A photodetector 56 receives interference light of the diffracted light generated in substantially the same direction after transmission by the reference diffraction grating 55, and sends a sinusoidal photoelectric signal SR, corresponding to the intensity of the diffracted light, to LIA calculation unit 58 in the main control system 18 (cf. FIG. 1).

On the other hand, the two laser beams reflected by the beam splitter 49 mutually cross at the aperture of a field diaphragm 51 by an objective lens 50, and enter the projection optical system 13 through a mirror M2 (mirror M1 in FIG. 1 being omitted). The two laser beams thus entering the projection optical system 13 are once condensed as spots, substantially symmetrical with respect to the optical axis AX, on the pupil plane of the projection optical system 13, and then are formed as parallel light beams inclined symmetrically to the optical axis AX in the pitch direction (Y-direction) of the wafer mark on the wafer W, thus entering the wafer mark from two different directions with a predetermined crossing angle. On the wafer mark there are formed one-dimensional interference fringes moving with a velocity corresponding to the frequency difference $\Delta f$, and the ±1st-order diffracted light beam (interference light) generated in the same direction, namely axial direction in this case, from the wafer mark are received through the projection optical system 13, objective lens 50 etc. by a photodetector 52, which supplies the LIA calculation unit 58 with a sinusoidal photoelectric signal SDw corresponding to the periodic intensity changes of the interference fringes. The LIA calculation unit 58 calculates the amount of positional aberration of the wafer mark from the phase difference of the two photoelectric signals SR, SDw, also determines the coordinate position of the wafer stage WS when the positional aberration becomes zero, utilizing the position signal PDs from the laser interferometer 15, and sends this information to an alignment data memory portion 61 (cf. FIG. 3).

The LSA optical system 46 includes a beam expander, a cylindrical lens etc., and the laser beam emitted therefrom enters the objective lens 50 through the beam splitters 48, 49. The laser beam emitted from the objective lens 50 is once condensed in a slit form at the aperture of field diaphragm 51, and enters the projection optical system 13 through the mirror M2. The laser beam thus entering the projection optical system 13 passes the approximate center of the pupil plane thereof, and is projected onto the wafer W as an oblong spot extended in the X-direction toward the optical axis AX within the image field of the projection optical system 13.

The light generated from the wafer mark (diffraction grating mark) on the wafer W at the relative movement of the light spot and the wafer mark in the Y-direction is received through the projection optical system 13, objective lens 50 etc. by the photodetector 52, which effects photoelectric conversion only on the 1st to 3rd order diffracted light, among the light beams coming from the wafer mark, and sends a photoelectric signal SDi, corresponding to the light intensity, to LSA calculation unit 57 in the main control system 18. The LSA calculation unit 57 also receives the position signal PDs from the laser interferometer 15, and samples the photoelectric signal SDi in synchronization with an up-down pulse generated at each unit displacement of the wafer stage WS. Furthermore, the LSA calculation unit 57 converts the sampled values into digital values, stores these values in succession in a memory, then effects predetermined processing to determine the position of the wafer mark in the Y-direction, and sends this information to the alignment data memory portion 61 shown in FIG. 3.

Figure 3:
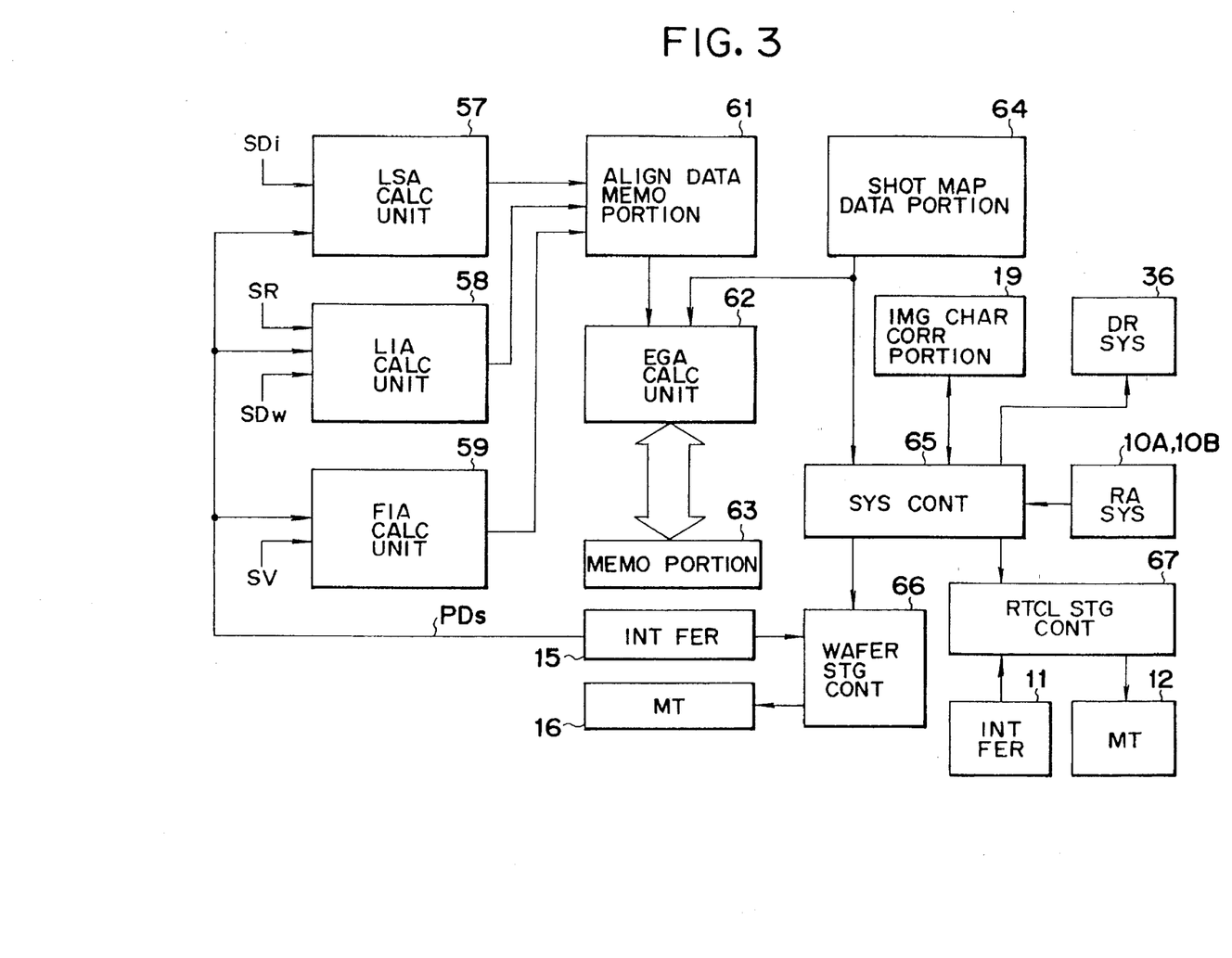
FIG. 3 is a block diagram showing the details of a main control system 18 etc.

FIG. 3 shows the configuration of the main control system 18 of the present embodiment, and related components. The main control system 18 is composed of LSA calculation unit 57, LIA calculation unit 58, FIA calculation unit 59, an alignment data memory portion 61, an EGA calculation unit 62, a memory portion 63, a shot map data portion 64, a system controller 65, a wafer stage controller 66 and a reticle stage controller 67. Among these components, the LSA calculation unit 57, the LIA calculation unit 58 and the FIA calculation unit 59 determine the coordinate positions of the wafer marks in the stage coordinate system (X, Y) from the corresponding photoelectric signals and send the determined coordinate positions to the alignment data memory portion 61. The measured coordinate positions stored in the alignment data memory portion 61 are supplied to the EGA calculation unit 62.

The shot map data memory portion 64 stores the design coordinate values of the arrangement of the wafer marks, respectively belonging to the shot areas on the wafer W, on the coordinate system (x, y) on the wafer W, and these design coordinate values are also supplied to the EGA calculation unit 62. The EGA calculation unit 62 determines, based on the measured coordinate values and the design coordinate values, six transformation parameters by the minimum square method, for obtaining the calculated coordinate values on the stage coordinate system (X, Y) from the design coordinate values on the coordinate system (x, y) on the wafer W (corresponding to the transformation parameters a–f in the aforementioned equation (1)), and stores these parameters in the memory portion 63.

The system controller 65 causes the LSA calculation unit 57, the LIA calculation unit 58 and the FIA calculation unit 59 to calculate the coordinate positions of the wafer marks, and, in response, the EGA calculation unit 62 determines the transformation parameters a–f. Utilizing these parameters a–f, the EGA calculation unit 62 determines the calculated coordinate values on the stage coordinate system (X, Y) from the design coordinate values on the coordinate system (x, y) on the wafer W, and supplies the system controller 65 with the calculated coordinate values.

In response, the system controller 65 drives the wafer stage WS by the motor 16 while monitoring the measured value of the laser interferometer 15 through the wafer stage controller 66, thereby effecting positioning of each shot area on the wafer W and exposure of each shot area. Also the system controller 65 regulates the position of the reticle R by driving the reticle stage RS shown in FIG. 1, through the motor 12, while monitoring the measured value of the laser interferometer 11 through the reticle stage controller 67.

In the following there will be explained the operations of positioning each shot area on the wafer W and exposing each shot area to the projected image of the pattern of the reticle R. At first there will be given an explanation on the arrangement of shot areas on the wafer W and the form of the wafer marks serving as the alignment marks.

Figure 4A:
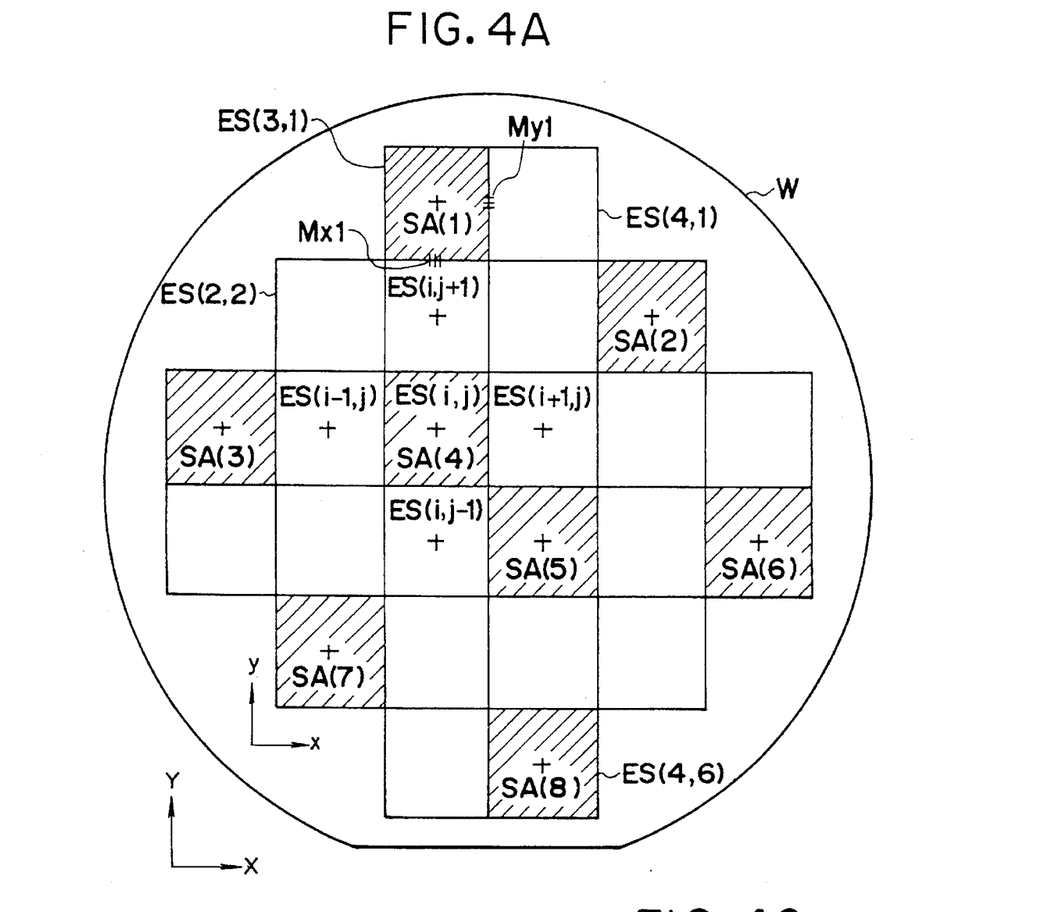
FIG. 4A is a plan view showing the arrangement of shot areas on a wafer to be exposed in the foregoing embodiment.

FIG. 4A shows the arrangement of the shot areas on the wafer W. On the wafer W, along the coordinate system (x, y) defined thereon, there are regularly formed shot areas ES(3, 1), ES(4, 1), . . . , ES(4, 6), wherein each shot area (exposed shot) ES(i, j) bears a chip pattern formed in the preceding steps. Each exposure shot ES(i, j) is defined by street lines of a predetermined width extending in the X- and Y-directions, and a wafer mark for the X-direction is formed at the center of the street line extending in the X-direction and adjacent to each exposure shot ES(i, j), while a wafer mark for the Y-direction is formed at the center of the street line extending in the Y-direction and adjacent to each exposure shot ES(i, j). Among these wafer marks, a wafer mark Mx1 for the X-direction and a wafer mark My1 for the Y-direction are illustrated in FIG. 4A. Such wafer mark Mx1 or My1 is composed of three line patterns arranged with a predetermined pitch in the x- or y-direction, and these patterns are formed as projecting or recessed patterns on the wafer W.

At the exposure operation of the wafer W, for example eight shot areas, indicated by hatched areas, are selected from the exposure shots ES(i, j). Each of thus selected sample shot areas SA(1)–SA(8) is associated with the wafer marks for the X- and Y-directions. In the present embodiment, the positions of these wafer marks are measured to determine the coordinate positions of sample shots SA(1)–SA(8) on the stage coordinate system (X, Y). More specifically the image signal of the wafer mark Mx1 is supplied through the image pickup device 34 to the FIA calculation unit 59 shown in FIG. 3, which detects the position of the wafer mark Mx1 in the X-direction, under the predetermined measuring parameters.

Figure 5:
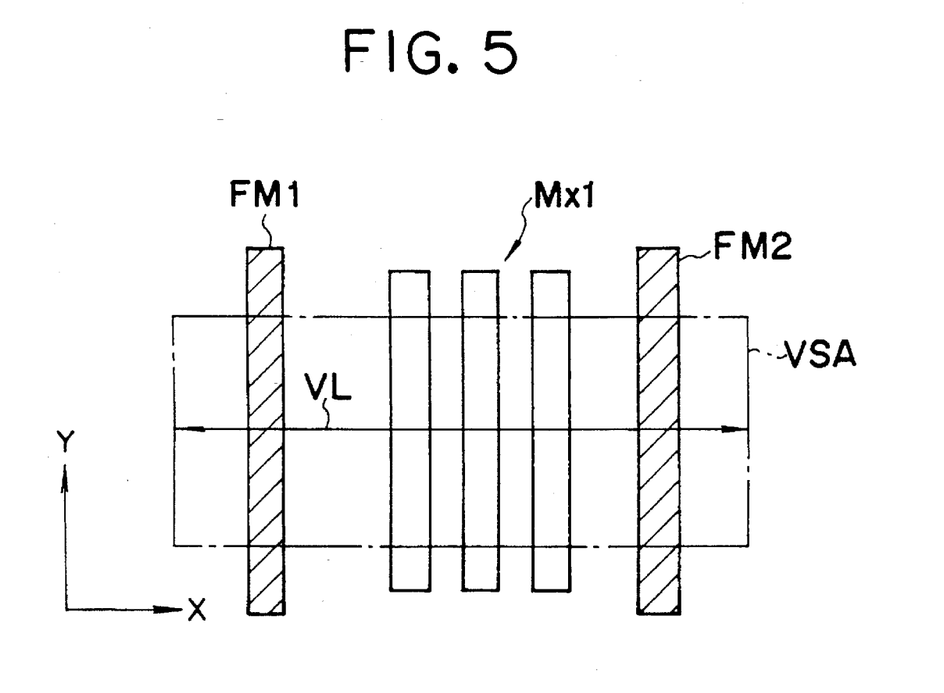
FIG. 5 is a view showing the observation area of the image pickup device of an alignment sensor of FIA system.

FIG. 5 shows the wafer mark Mx1 imaged by the image pickup device 34 of the FIA system shown in FIG. 2, and the obtained image signal is stored in a wave form memory circuit 61 shown in FIG. 3. As shown in FIG. 5, in the image taking field VSA of the image pickup device 34, there are positioned the wafer mark Mx1 consisting of three line patterns and index marks FM1, FM2 of the index plate 30 shown in FIG. 1, positioned on both sides. The image pickup device 34 electrically scans the images of the wafer mark Mx1 and the index marks FM1, FM2 along a horizontal scanning line VL. Since a single scanning line may not be able to provide a sufficiently high S/N ratio, it is preferable to average, in each pixel in the horizontal direction, the image signals obtained from plural horizontal scanning lines within the field VSA. The position of the wafer mark Mx1 in the X-direction can thus be measured, and that of the wafer mark My1 in the Y-direction is similarly measured by the FIA system for the Y-direction.

Figure 4B:
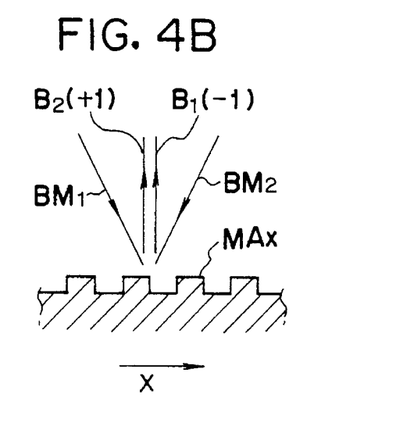
FIG. 4B is a schematic view showing the detecting method for a wafer mark for LIA system.

FIG. 4B shows another example of the wafer mark MAx consisting of a diffraction grating pattern of a predetermined pitch in the X-direction to be measured. For detecting the position of this wafer mark MAx, it is irradiated, with a predetermined crossing angle, with two laser beams BM1, BM2 emitted from the LIA optical system 45 (FIG. 2) in the alignment sensor 17 shown in FIG. 1. The above-mentioned crossing angle and the pitch of the wafer mark MAx in the X-direction are so determined that the −1st-order diffracted light B1(−1) generated by the wafer mark MAx from the laser beam BM1 and the +1st-order diffracted light B2(+1) generated by the wafer mark MAx from the laser beam BM2 become flat. The interference light of the −1st-order diffracted light B1(−1) and the +1st-order diffracted light B2(+1) is converted by the photodetector 52 shown in FIG. 2 into a photoelectric signal SDw, which is supplied to the LIA calculation unit 58 where the positional aberration of the wafer MAx in the X-direction is calculated from the phase difference between the photoelectric signal SR as the reference and the photoelectric signal SDw.

Figure 4C:
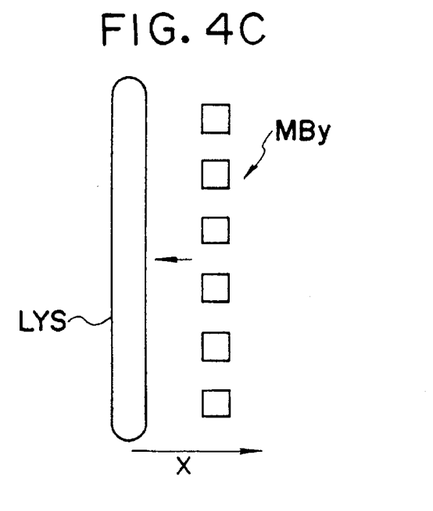
FIG. 4C is a schematic view showing the detecting method for a wafer mark for LSA system.

FIG. 4C shows still another example of the wafer mark. In this case a wafer mark MBy is composed of dots arranged with a predetermined pitch in the Y-direction, which is perpendicular to the X-direction to be measured. The position of this wafer mark MBy is detected by projecting the laser beam, emitted from the LSA optical system 46 (FIG. 2) in the alignment sensor 17 in FIG. 1, as a slit-shaped light spot LYS elongated in the Y-direction, in the vicinity of the wafer mark MBy, and scanning the light spot LYS with the wafer mark MBy by driving the wafer stage WS shown in FIG. 1, whereby the wafer mark MBy emits diffracted light in a predetermined direction while the light spot LYS remains on the wafer mark MBy. A photoelectric signal SDi, obtained by photoelectric conversion of the diffracted light in the photodetector 52, shown in FIG. 2, is supplied to the LSA calculation unit 57, which in response determines the position of the wafer mark MBy in the X-direction under the predetermined measuring parameters.

In the following there will be explained an example of the entire operations of the projection exposure apparatus of the present embodiment, in the exposure of each exposure shot ES(i, j) of the wafer W shown in FIG. 4A to the image of the pattern of the reticle R. This embodiment is featured by a novel determination of weighting coefficients in the weighted EGA (enhanced global alignment) method.

At first there are measured the coordinate values of the wafer marks belonging to the eight sample shots SA(1)–SA(8) shown in FIG. 4A, in the stage coordinate system (X, Y). The above-mentioned measurement is conducted for example by the FIA system including the image pickup device 34 shown in FIG. 1, but the LIA system or the LSA system may be employed also, depending on the shape of the wafer marks. The measured coordinate values are supplied, through the alignment data memory portion 61 shown in FIG. 2, to the EGA calculation unit 62, which determines, by the weighted minimum square method, the six transformation parameters a–f satisfying the foregoing equation (1), utilizing the design coordinate values and the measured values of the wafer marks. This operation is called the weighted EGA calculation.

More specifically, in case of employing the W1-EGA method which is the first method among the weighted EGA methods, in the determination of the calculated coordinate position of an exposure shot ES(i, j) on the wafer W, the measured coordinate positions (alignment data) of m sample shots SA(1)–SA(8) (m=8 in case of FIG. 4A) are respectively given weights $W_{ijn}$ depending on the distances LK1–LK8 between said exposure shot and the sample shots. Thus the remnant error component $E_{ij}$ is defined as follows:

$$E_{ij} = \sum_{n=1}^{m} W_{ijn} \{(Xn - XMn)^2 + (Yn - YMn)^2\} \quad (2)$$

The transformation parameters a–f of the equation (1) are so determined as to minimize the above-defined remnant error component $E_{ij}$. Though the same sample shots SA(1)–SA(8) are used for different exposure shots ES(i, j), the distance to each sample shot SA(n) naturally varies for each exposure shot ES(i,j). Consequently the weight $W_{ijn}$ given to the coordinate position (alignment data) of the sample shot SA(n) varies for each exposure shot ES(i, j). Thus, the calculated coordinates of the arrangement of the entire exposure shots on the wafer W are determined by determining the transformation parameters a–f for each exposure shot ES(i, j) and calculating the coordinate position from the equation (1).

In the W1-EGA method, as explained in the foregoing, the weight $W_{ijn}$ for the coordinate data of each sample shot SA(n) varies for each exposure shot ES(i, j) on the wafer W. As an example, the above-mentioned weight $W_{ijn}$ is represented as follows, as a function of the distance LKn between the exposure shot ES(i, j) and the n-th sample shot SA(n), wherein a parameter S is provided for varying the level of weighting:

$$W_{ijn} = \frac{1}{\sqrt{2\pi S}} \exp\{-LKn^2/(2S)\} \quad (3)$$

As will be apparent from this equation, the weight $W_{ijn}$ assigned to the alignment data becomes larger as the distance LKn of the sample shot SA(n) to the exposure shot ES(i, j) becomes shorter.

Also in the equation (3), the result of statistical processing becomes substantially equal to that in the ordinary EGA method, if the parameter S is sufficiently large. On the other hand, if all the exposure shots ES(i, j) on the wafer are taken as the sample shots SA(n) and if the parameter S is selected sufficiently close to zero, the result becomes substantially equal to that of so-called die-by-die method in which the alignment is achieved by measuring the position of the wafer mark for each shot area. Stated differently, the W1-EGA method can provide an effect between the EGA method and the die-by-die method, by suitable selection of the parameter S.

As an example, the parameter S can be given by the following equation:

$$S=D^2/(8 \cdot \log_e 10) \quad (4)$$

wherein D is a weighting parameter, and, by suitable selection of weighting parameter D by the operator, there can automatically be determined the parameter S, and the weights $W_{ijn}$.

This weighting parameter D has a physical meaning representing a zone of the sample shots effective for calculating the coordinate positions of the shot areas on the wafer (hereinafter simply called "zone"). If the zone is large, the number of effective sample shots increases, so that the obtained result becomes close to the result in the conventional EGA method. On the other hand, if the zone is small, the number of effective sample shots decreases, so that the obtained result comes close to the result in the die-by-die method.

The equation determining the parameter S is not limited to the equation (4), but can be, for example, the following equation (5):

$$S=A/(m \cdot C) \quad (5)$$

wherein A is the wafer area (mm²), m is the number of sample shots and C is a correction coefficient (positive real number).

This equation (5) intends the variation in the wafer size (area) and in the number of sample shots to be reflected in the determination of the parameter S thereby avoiding excessive variation of the otpimum value of the correction coefficient C to be employed in such determination. If the correction coefficient C is small, the parameter S becomes large so that the result comes close to that of the conventional EGA method, while, if the correction coefficient C is large, the parameter S becomes small so that the result comes close to that of the conventional die-by-die method. In this case, by mere entry of the correction coefficient C, determined in advance by an experiment or a simulation, into the exposure apparatus by the operator or by a code reading device, the equation (5) automatically determines the weights assigned to the alignment data, namely the weights $W_{ijn}$ defined by the equation (3).

The W1-EGA method may also be replaced by the second weighted EGA method (W2-EGA method). In this method, the distances (radii) between the center of non-linear distortion of the wafer W (namely the center of the wafer) and an exposure shot ES(i, j) on the wafer W are defined as $LE_{ij}$ while the distances (radii) between the wafer center and m sample shots SA(1)–SA(8) (m=8 in this example) are defined as LW1–LW8, and each of the alignment data of eight sample shots SA(1)–SA(8) is given a weight $W_{ijn}'$ defined by the following equation, defined by the distances $LE_{ij}$ and LW1–LW8, in a similar manner as in the W1-EGA method:

$$W_{ijn}' = \frac{1}{\sqrt{2\pi S}} \exp\{-(LE_{ij} - LWn)^2/(2S)\} \quad (6)$$

The parameter S in the equation (6) may also be defined by the equation (4) or (5), and the weight $W_{ijn}'$ may be used instead of the weight $W_{ijn}$ in the equation (2) and the transformation parameters a–f are so determined as to minimize the remnant error component $E_{ij}$ given by the equation (2).

Then the EGA calculation unit 62 determines the calculated coordinates of the exposure shots ES(i, j) by substituting thus determined transformation parameters a–f and the design coordinates of the exposure shots ES(i, j) in the equation (1).

Figure 6A:
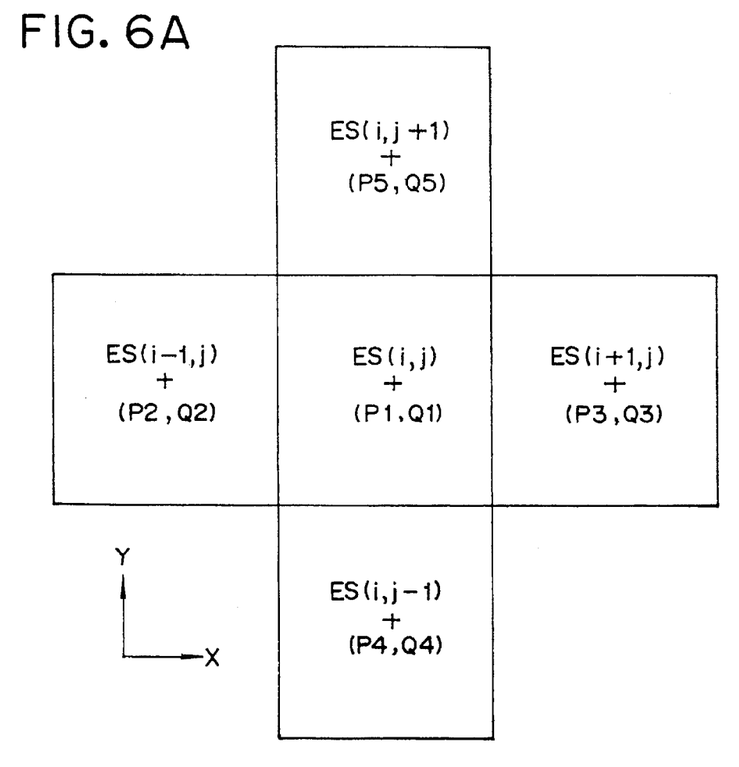
FIG. 6A is a view showing the arrangement of shot areas to be used in the determination of distortion within shot.

Subsequently the amount of distortion within each exposure shot ES(i, j) is determined from thus determined calculated coordinates. In the following there will be explained a specific example, in which, as shown in FIG. 6A, the exposure shots ES(i–1, j), ES(i+1, j) laterally adjacent to the object exposure shot ES(i, j) and those ES(i, j+1), ES(i, j–1) vertically adjacent thereto have the following positional aberrations (vectors) between the design coordinates and the calculated coordinates:

(P1, Q1): positional aberration of exposure shot ES(i, j);

(P2, Q2): positional aberration of exposure shot ES(i–1, j);

(P3, Q3): positional aberration of exposure shot ES(i+1, j);

(P4, Q4): positional aberration of exposure shot ES(i, j–1);

(P5, Q5): positional aberration of exposure shot ES(i, j+1).

Figure 6B:
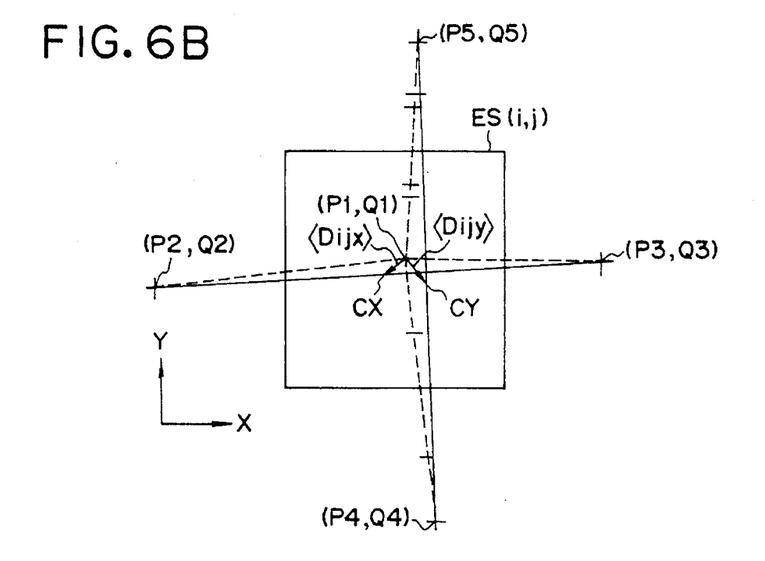
FIG. 6B is a view showing a vector corresponding to the distortion within shot.

Based on these data, the distortion Dij within each exposure shot ES(i, j) is defined, as shown in FIG. 6B, in the following manner by a distortion vector <Dijx> in the X-direction and a distortion vector <Dijy> in the Y-direction:

$$Dij = (<Dijx>, <Dijy>) \quad (7)$$

The distortion vector <Dijx> in the X-direction and that <Dijy> in the Y-direction are defined as follows:

$$<Dijx> = ((P2+P3-2\times P1)/2, (Q2+Q3-2\times Q1)/2)$$

$$<Dijx> = ((P4+P5-2\times P1)/2, (Q4+Q5-2\times Q1)/2) \quad (8)$$

The distortion vector <Dijx> in the X-direction is defined by a vector from the center of the exposure shot ES(i, j) to the central point CX of the exposure shots on both sides in the X-direction, and the distortion vector <Dijy> in the Y-direction is defined by a vector from the center of the exposure shot ES(i, j) to the central point CY of the exposure shots adjacent on both sides in the Y-direction.

If the exposure shot is positioned at an end of the wafer W so that the distortion cannot be calculated because of the absence of an adjacent exposure shot, the distortion of a nearby exposure shot is used instead. For example, for the exposure shot at the left-hand end of the wafer W, the distortion vector for the X-direction therefor is taken from the X-component of the distortion of an exposure shot adjacent to the right. In such case, the component in the Y-direction is calculated in the ordinary manner.

Then the length of a portion of a straight line connecting an exposure shot ES(p, q) and a sample shot SA(k), falling within an exposure shot ES(i, j) is defined as L(i, j), and the amount of distortion D(pqk) between the sample shot SA(k) and the exposure shot ES(p, q) is determined as the summation of product of the distortion in each exposure shot ES(i, j) and the above-defined internal length L(i, j). The distortion amount D(pqk) can be divided into vectors of X- and Y-directions in the following manner:

$$D(pqk) = (<Dx(pqk)>, <Dy(pqk)>) \quad (9)$$

The vector <Dx(pqk)> in the X-direction and that <Dy(pqk)> in the Y-direction are respectively defined as follows, wherein $\Sigma ij$ indicates summation for the suffixes i and j:

$$<Dx(pqk)> = \Sigma ij L(i, j) <Dijx>$$

$$<Dy(pqk)> = \Sigma ij L(i, j) <Dijy> \quad (10)$$

Figure 7:
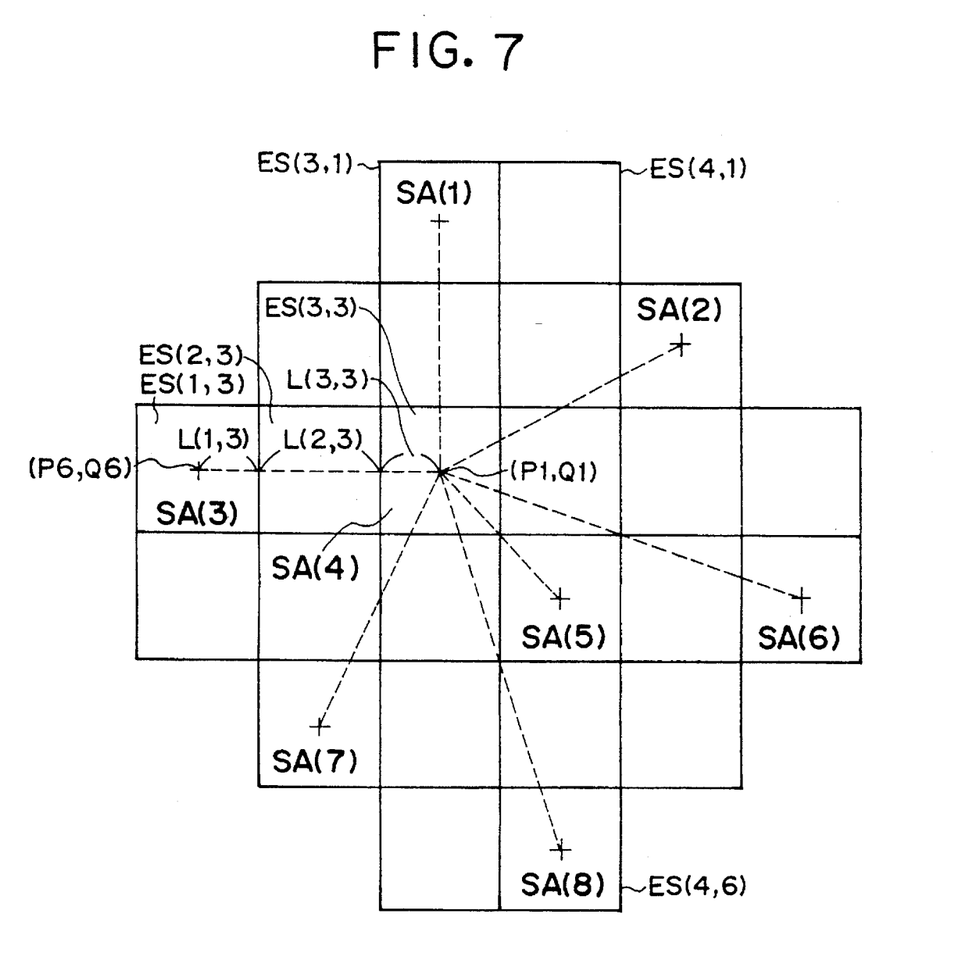
FIG. 7 is a view showing the principle of weight determination for a sample shot SA(3)

The distortion amount D(pqk) is calculated on the assumption that the exposure shots are regularly arranged on the wafer, with a predetermined shot pitch. As an example shown in FIG. 7, for an exposure shot ES(3, 3), the components <Dx(333)> and <Dy(333)> of the distortion amount D(333) of the sample shot SA(3) are given in the following manner:

$$<Dx(333)> = L(1, 3) <D13x> + L(2, 3) <D23x> + L(3, 3) <D33x>$$

$$<Dy(333)> = L(1, 3) <D13y> + L(2, 3) <D23y> + L(3, 3) <D33y> \quad (11)$$

In this embodiment, weights Wx(pqk) and Wy(pqk) corresponding to the X-component <Dx(pqk)> and the Y-component <Dy(pqk)> of the distortion amount D(pqk) are assigned to the remnant error of each sample shot SA(k). An example of said weight Wx(pqk) is given by the difference between a predetermined constant C and the absolute value of the distortion component, as shown in the following:

$$Wx(pqk) = C - |<Dx(pqk)>| \quad (C \geq |<Dx(pqk)>|); \quad (12)$$

$$Wx(pqk) = 0 \quad (C < |<Dx(pqk)>|).$$

The weight Wy(pqk) in the Y-direction can be represented in a similar manner. Thus the weights Wx(pqk) and Wy(pqk) become smaller as the distortion amount increases.

Then the EGA calculation is conducted for each exposure shot ES(p, q), weighting the X- and Y-components of the remnant error of each sample shot SA(k) with the above-mentioned weights Wx(pqk) and Wy(pqk). Thus the remnant error component Epq, corresponding to the equation (2), can be represented as follows:

$$Epq = \sum_{n=1}^{m} \{Wx(pqn)(Xn - XMn)^2 + Wy(pqn)(Yn - YMn)^2\} \quad (13)$$

Then the transformation parameters a–f of the equation (1) are determined for each exposure shot ES(p, q) so as to minimize the above-mentioned remnant error component, and the calculated coordinates of arrangement on the stage coordinate system (X, Y) can be determined from the transformation parameters a–f and the design coordinates of the exposure shot. The baseline amounts, which are the distances between the centers of measurement of the alignment sensors of the FIA system, LIA system and LSA system and a reference point within the exposure field of the projection optical system 13, are respectively determined in advance. Thus the system controller 65 positions the shot areas ES(p, q) in succession according to the calculated coordinates obtained by applying the baseline correction to the calculated coordinates obtained by the EGA calculation unit 62, thereby exposing the shot areas to the image of the pattern of the reticle R.

Figure 8A:
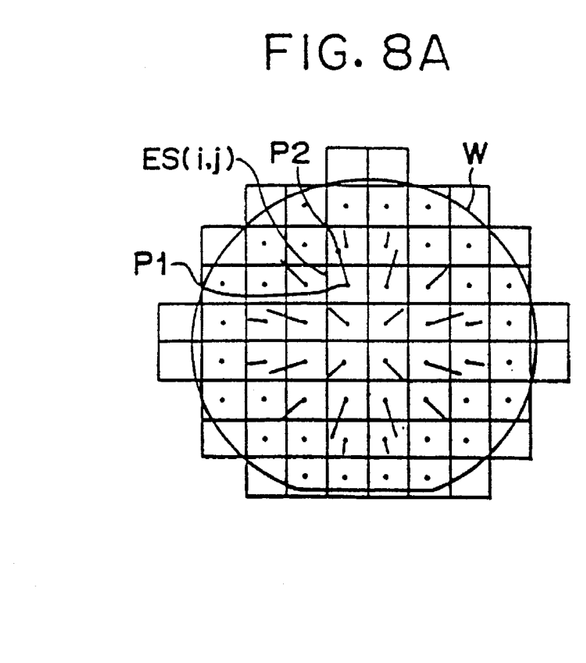
FIG. 8A is a plan view showing an example of the wafer involving local distortion.

In the following there will be explained the result of the method of this embodiment, applied to a wafer W involving distortion as shown in FIG. 8A, in which, a line drawn from an external point P2 to the central point P1 of an exposure shot ES(i, j) indicates that the center of said exposure shot ES(i, j) has moved from a design point P1 to the point P2 by the preceding process steps. Consequently the wafer W shown in FIG. 8A shows local distortion as if the central portion only has been radially extended.

Figure 8B:
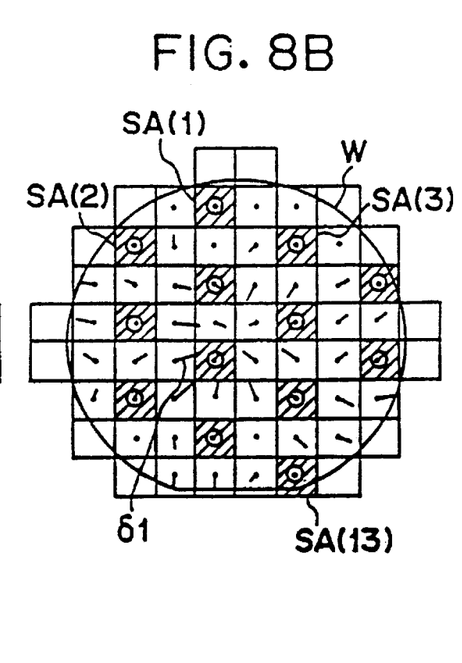
FIG. 8B is a view showing remnant errors in the alignment with weighted EGA method employing weights determined irrespective of the distortion.

For such wafer W, the hatched 13 exposure shots shown in FIG. 8B were taken as the sample shots SA(1)–SA(13), and the alignment was conducted with the simple weighted EGA method, in which the remnant error component was represented by the equation (2). As a result, there were obtained remnant errors, which are the difference between the calculated coordinates and the actual coordinates of the exposure shots, as indicated by lines in FIG. 8B.

Figure 8C:
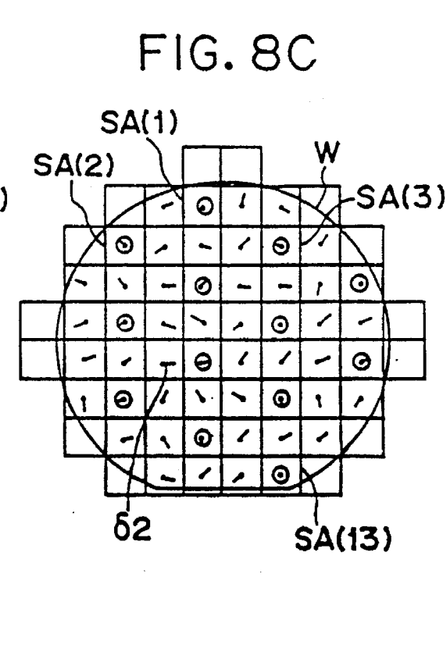
FIG. 8C is a view showing remnant errors in the alignment with weighted EGA method employing weights determined according to the distortion.

On the other hand, in the alignment with the weighted EGA method of the present embodiment in which the weight is varied by the distortion amount represented by the remnant error component of the equation (13), the remnant errors in the exposure shots became extremely small as shown in FIG. 8C, and there was observed an improvement in the precision of alignment. For example, in comparison with the remnant error vector δ1 of an exposure shot in FIG. 8B, the absolute value of the remnant error vector δ2 of the corresponding exposure shot in FIG. 8C is significantly smaller.

Also the determination of the weights Wx(pqk) and Wy(pqk) corresponding to the X-component <Dx(pqk)> and the Y-component <Dy(pqk)> of the distortion amount D(pqk) is not limited to the foregoing equations (12) but may also be based on the following function employing a predetermined constant C:

$$Wx(pqk)=1/(C+|<Dx(pqk)>|) \quad (14)$$

Furthermore, in more general terms, the weights Wx(pqk) and Wy(pqk) may be determined by any function so as to become smaller as the distortion amounts $|<Dx(pqk)>|$ and $|<Dy(pqk)>|$ become larger.

Then, in the foregoing embodiment, the distortion amount in each exposure shot is determined by calculation of the arrangement coordinates of each exposure shot by the weighted EGA method, based on the measured coordinates of the sample shots. However the determination of the distortion amount in each exposure shot is not limited to such method, but can also be achieved, for example, by the following method.

In this alternative method, for each sample shot SA(i) as shown in FIG. 4A, there is determined the relative difference between the measured coordinate (P1, Q1) of the center of said sample shot and the measured coordinate (Pj, Qj) of the center of another sample shot SA(j) which is distant by m and n shots, respectively in the X- and Y-directions, from the first-mentioned sample shot. Then, linear interpolation between two points is used to determine a relative positional difference ($\Delta$Xij, $\Delta$Yij) of the crossing point of a line connecting the centers of the sample shots SA(i) and SA(j) and a side of the sample shot SA(i), with respect to the center of said exposure shot, in the following manner;

$$\Delta Xij=(Pj-Pi)/\{(2m)^2+(2n)^2\}^{1/2}$$

$$\Delta Yij=(Qj-Qi)/\{(2m)^2+(2n)^2\}^{1/2} \quad (15)$$

The external shape of the sample shot SA(i) is determined from these results. For this purpose the coordinates of the sides of the sample shot SA(i) are determined by minimum square approximation for the axes in the X- and Y-directions, with a weight corresponding to the distance between the shots assigned to each relative positional difference (the weight for example being the reciprocal of the distance), employing the relative positional difference ($\Delta$Xij, $\Delta$Yij) (j=1, 2, . . . , 8; j ≠i) of the crossing point between the line connecting the centers of the shots and the side, with respect to the shot center.

Based on these results, there can be obtained the center of the sample shot SA(i), the relative positional differences of the centers of the right and left sides and those of the centers of the upper and lower sides, and these relative positional differences can be regarded as the distortion within the shot area. It is thus possible to determine the distortions of the sample shots, and to determine the distortions in other exposure shots (non-sample shots) by linear interpolation of the distortions of the sample shots.

It is furthermore possible, instead of determining the distortion amount in each shot area by determining the arrangement coordinates of the shot areas by the weighted EGA method, to detect the alignment marks associated respectively with all the shot areas on the wafer by means of the alignment sensor and to determine the distortion amounts of the shot areas from thus measured coordinates.

The present invention is not limited to the foregoing embodiments but is subject to various modifications within the scope and spirit of the appended claims.

What is claimed is:

1. An alignment method for aligning each of plural process areas arranged on a substrate to a specified position in a fixed coordinate system defining the position of movement of said substrate, comprising steps of:

measuring coordinate positions of specified areas selected in advance from the plural process areas on said substrate;

determining plural amounts of distortion between said specified areas and one of said process areas;

determining plural weighting coefficients, corresponding to said plural amounts of distortion, for each of said specified areas; and calculating the coordinate position of said one process area on said fixed coordinate system, by statistical processing of the measured coordinate positions of said specified areas, utilizing said plural weighting coefficients.

2. An alignment method according to claim 1, wherein said step for calculating the coordinate position is adapted to calculate the coordinate position of each of said plural process areas arranged on the substrate on the fixed coordinate system by statistical processing of the measured coordinate positions of said specified areas, utilizing said plural weighting coefficients.

3. An alignment method according to claim 1, wherein said step for determining the distortion amounts includes:

a step for determining other weighting coefficients according to the distances between specified areas on said substrate and said one process area; and a step for determining the coordinate position of said one process area by statistical processing of the measured coordinate positions of the last-mentioned specified areas, utilizing said other weighting coefficients; and is adapted to calculate the amounts of distortion based on the coordinate position of said one process area.

4. An alignment method according to claim 3, wherein the specified areas in the step for calculating the coordinate position on said fixed coordinate system are the same as those in the step for determining the coordinate position of said one process area.

5. An alignment method according to claim 1, wherein said step for determining the amounts of distortion includes a step for determining internal distortion of said one process area by processing of a predetermined coordinate position of said one process area and predetermined coordinate positions of process areas adjacent to said one process area; and is adapted to determine said amounts of distortion by processing internal distortions of a predetermined area of said specified areas, said one process area and another process area positioned between said one of said specified areas and said predetermined process area.

6. An alignment method according to claim 1, wherein said step of determining the amounts of distortion includes:

a step for determining other weighting coefficients corresponding to the distances between a central point of deformation of said substrate and said one process area and between a central point of deformation of said substrate and specified areas; and a step for determining the coordinate position of said one process area by statistical processing of the measured coordinate positions of the last-mentioned specified areas, utilizing said other weighting coefficients; and is adapted to determine the amounts of distortion based on the coordinate position of said one process area.

7. An alignment method according to claim 6, wherein, in said step for determining other weighting coefficients, said central point of deformation of the substrate is an arbitrary point of the substrate, including the actual center thereof.

8. An alignment method for aligning each of plural process areas arranged on a substrate to a specified position in a fixed coordinate system defining the position of movement of said substrate, comprising steps of:

measuring coordinate positions of specified areas selected in advance from the plural process areas on said substrate;

determining, for each of said specified areas, a weighting coefficient corresponding to an amount of distortion between said specified areas on said substrate and one of said process areas; and calculating the coordinate position of said one of said process areas on said fixed coordinate system, by statistical processing of the measured coordinate positions of said specified areas, utilizing said weighting coefficients.

9. An exposure method for exposing each of plural exposure areas on a substrate to an image of a pattern of a mask, comprising steps of:

measuring the positions of specified areas selected in advance from said plural exposure areas on said substrate;

determining plural amounts of distortion between said specified areas and one of said exposure areas;

determining weighting coefficients, corresponding to said plural amounts of distortion, for each of said specified areas;

calculating the coordinate position of said one of said exposure areas by statistical processing of the measured positions of said specified areas, utilizing said plural weighting coefficients; and moving said substrate based on said one coordinate position and exposing said one exposure area on said substrate.

10. An exposure method according to claim 9, wherein said step for calculating the coordinate position is adapted to calculate the coordinate position of each of said plural exposure areas arranged on the substrate, by statistical processing of the measured positions of said specified areas, utilizing said plural weighting coefficients.

11. An exposure method according to claim 9, wherein said step for determining the amounts of distortion includes:

a step for determining other weighting coefficients according to the distances between said specified areas on the substrate and said one exposure area; and a step for determining another coordinate position of said one exposure area by statistical processing of the measured coordinate positions of said specified areas, utilizing said other weighting coefficients, and is adapted to calculate the amounts of distortion, based on said another coordinate position of said one exposure area.

12. An exposure method according to claim 11, wherein the specified areas in the step for calculating the coordinate position of said one exposure area are the same as those in the step for determining another coordinate position of said one exposure area.

13. An exposure method according to claim 11, wherein said step for determining the amounts of distortion includes a step for determining internal distortion of said one exposure area by processing of another coordinate position determined in advance of said one exposure area and other coordinate positions, determined in advance, of exposure areas adjacent to said one exposure area; and is adapted to determine said amounts of distortion by processing of the internal distortions of a first of said specified areas, said one exposure area and another exposure area positioned between said first of said specified areas and said one exposure area.

14. An exposure method according to claim 11, further comprising:

a step for determining other weighting coefficients according to the distances between a central point of deformation of said substrate and said one exposure area and between a central point of deformation of said substrate and said specified areas; and a step for determining another coordinate position of said one exposure area, by statistical processing of the measured coordinate positions of said specified areas, utilizing said other weighting coefficients; and adapted to calculate the amounts of distortion based on said another coordinate position of said one exposure area.

15. An exposure method according to claim 14, wherein, in said step for determining said other weighting coefficients, said central point of deformation of said substrate is an arbitray point of the substrate, including the actual center thereof.

16. An alignment method of aligning each of plural process areas on a substrate to a specific position in a static coordinate system defining a position of movement of said substrate, comprising the steps of:

statistically calculating coordinate positions, on said static coordinate system, of at least three specified areas among said plural process areas, utilizing weighting coefficients corresponding to amounts of distortion between said specified areas and one of said plural process areas, so that a coordinate position of said one process area, on said static coordinate system, is determined; and moving said substrate based on said determined coordinate position.

17. A method according to claim 16, including the step of determining weighting coefficients corresponding to amounts of distortion between said specified areas and each process area and statistically calculating with the determined weighting coefficients, whereby a coordinate position of each of said plural process areas on said static coordinate system is determined.

18. A method according to claim 16, further comprising the step, prior to the statistical calculation, of measuring positions of said specified areas on said static coordinate system, and statistically calculating said measured coordinate positions with weighting coefficients other than the first-mentioned weighting coefficients, so that coordinate positions of said process areas are determined; and calculating said amounts of distortion based on the determined coordinate positions, whereby the first-mentioned weighting coefficients are determined in accordance with the calculated amounts of distortion.

* * * * *